United States Patent

Baskin

[11] Patent Number: 5,910,743
[45] Date of Patent: Jun. 8, 1999

[54] HIGH EFFICIENCY PULSE WIDTH MODULATOR

[75] Inventor: Brian L. Baskin, Cupertino, Calif.

[73] Assignee: Power System Management, Inc., Cupertino, Calif.

[21] Appl. No.: 08/887,760

[22] Filed: Jul. 3, 1997

[51] Int. Cl.$^6$ .................................................. H03K 3/017
[52] U.S. Cl. .......................... 327/172; 327/175; 327/363
[58] Field of Search .................................... 327/100, 113, 327/114, 178, 179, 363, 512, 513, 172, 175; 330/260, 278, 279, 282, 291, 293, 294

[56] References Cited

U.S. PATENT DOCUMENTS

| | | | |
|---|---|---|---|
| 5,170,636 | 12/1992 | Hitosugi | 62/175 |
| 5,515,258 | 5/1996 | Viertler | 363/26 |
| 5,517,523 | 5/1996 | Nabors et al. | 375/228 |
| 5,539,354 | 7/1996 | Carsten | 327/559 |
| 5,548,570 | 8/1996 | Hirajima et al. | 369/59 |
| 5,563,776 | 10/1996 | Eck | 363/26 |
| 5,594,324 | 1/1997 | Canter et al. | 323/282 |
| 5,613,233 | 3/1997 | Vagher | 455/296 |

*Primary Examiner*—Kenneth B. Wells
*Attorney, Agent, or Firm*—Boris G. Tankhilevich

[57] ABSTRACT

The apparatus and the method representing an improved power management system are disclosed. The apparatus incudes a feedback control system with a delay element. The delay element introduces the oscillation frequency outside the input frequency band into the feedback control system. Therefore, the apparatus emulates a very efficient pulse width modulator (PWM) with a feedback. The apparatus additionally includes a pulse shaper amplifier that squares the pulse of the output signal.

16 Claims, 3 Drawing Sheets

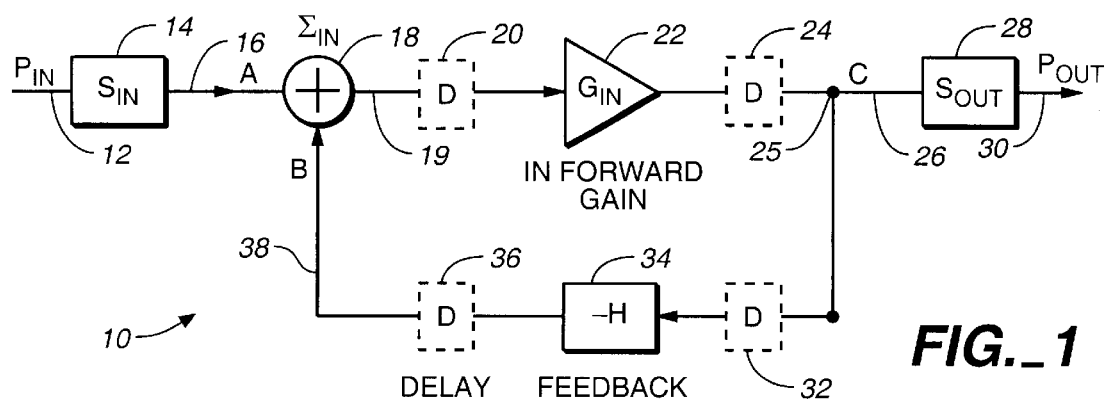
FIG._1
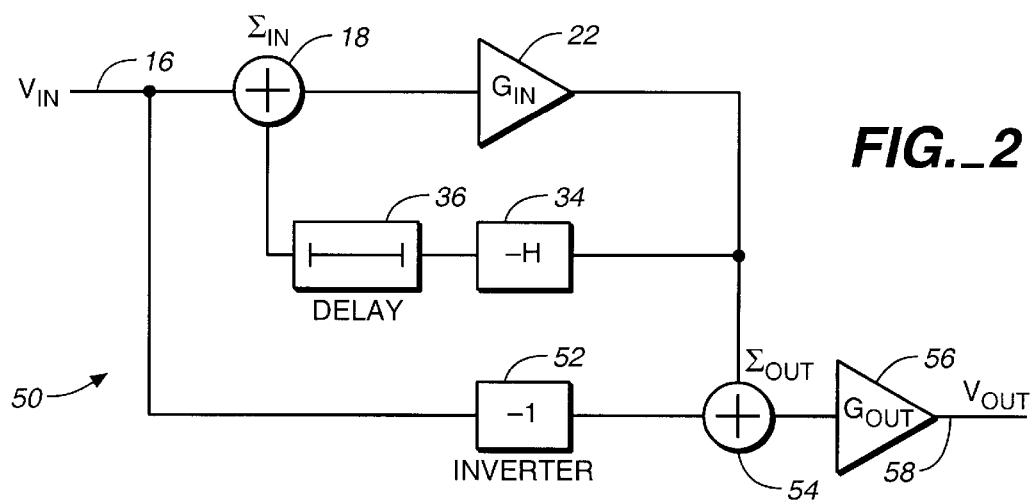
FIG._2
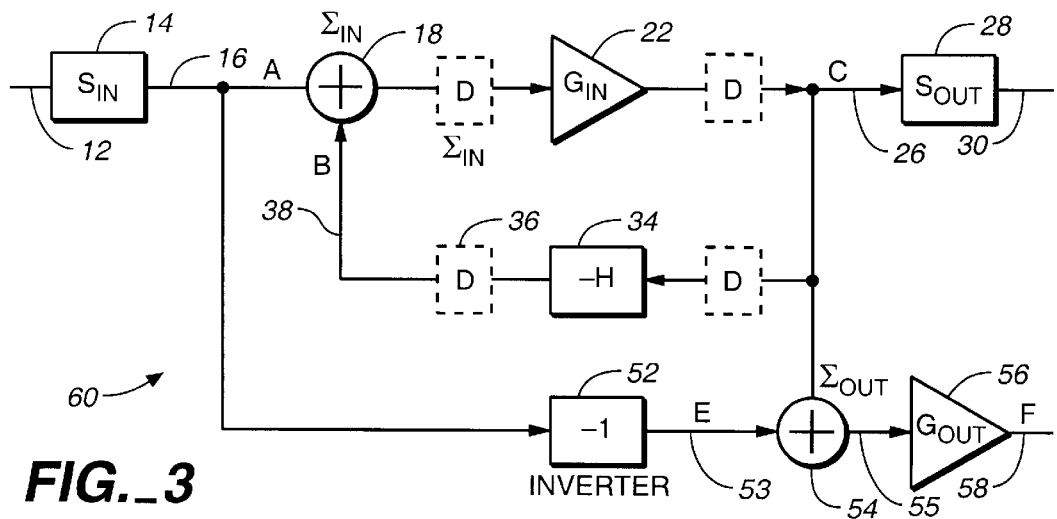
FIG._3

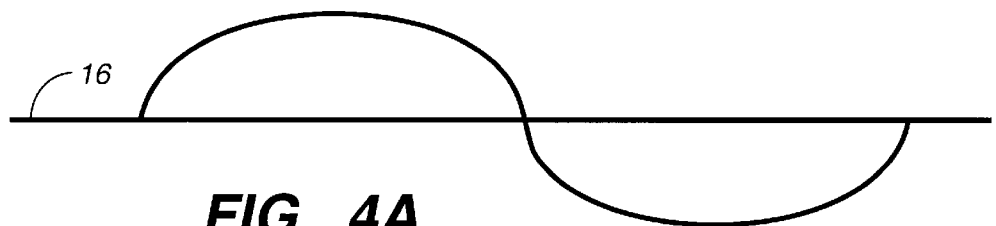
FIG._4A
FIG._4B
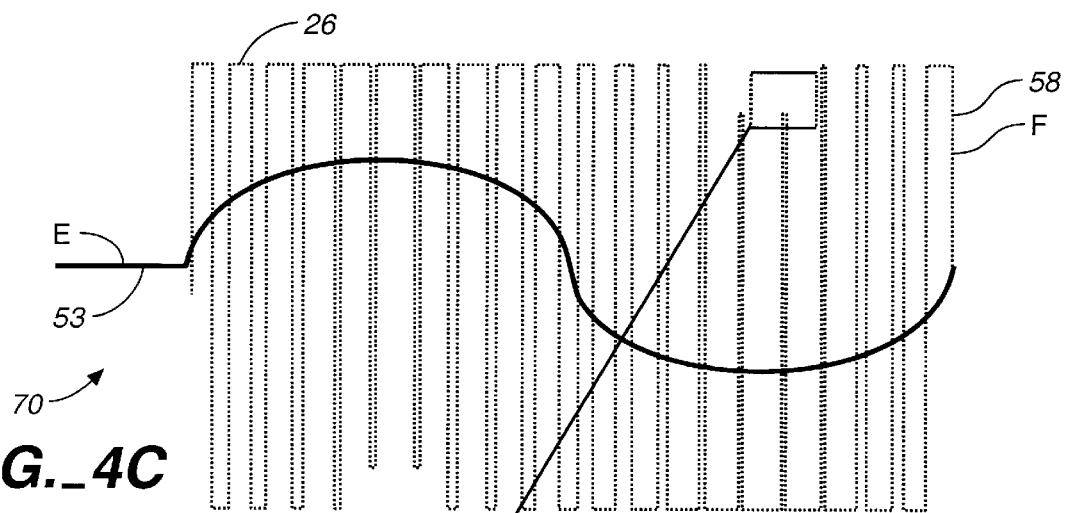
FIG._4C
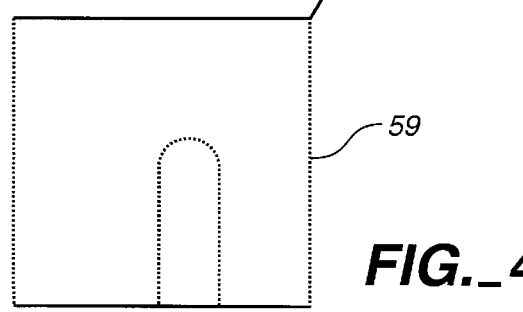
FIG._4D

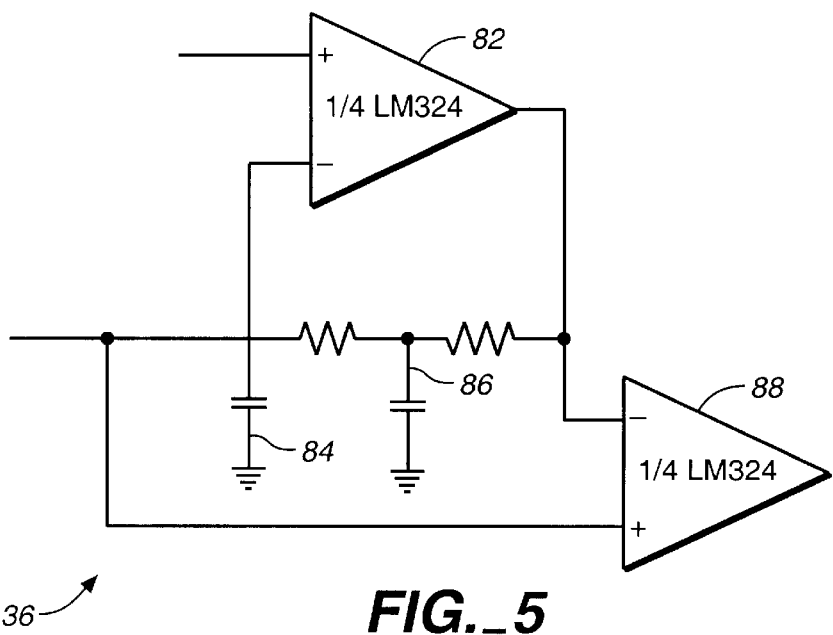
FIG._5
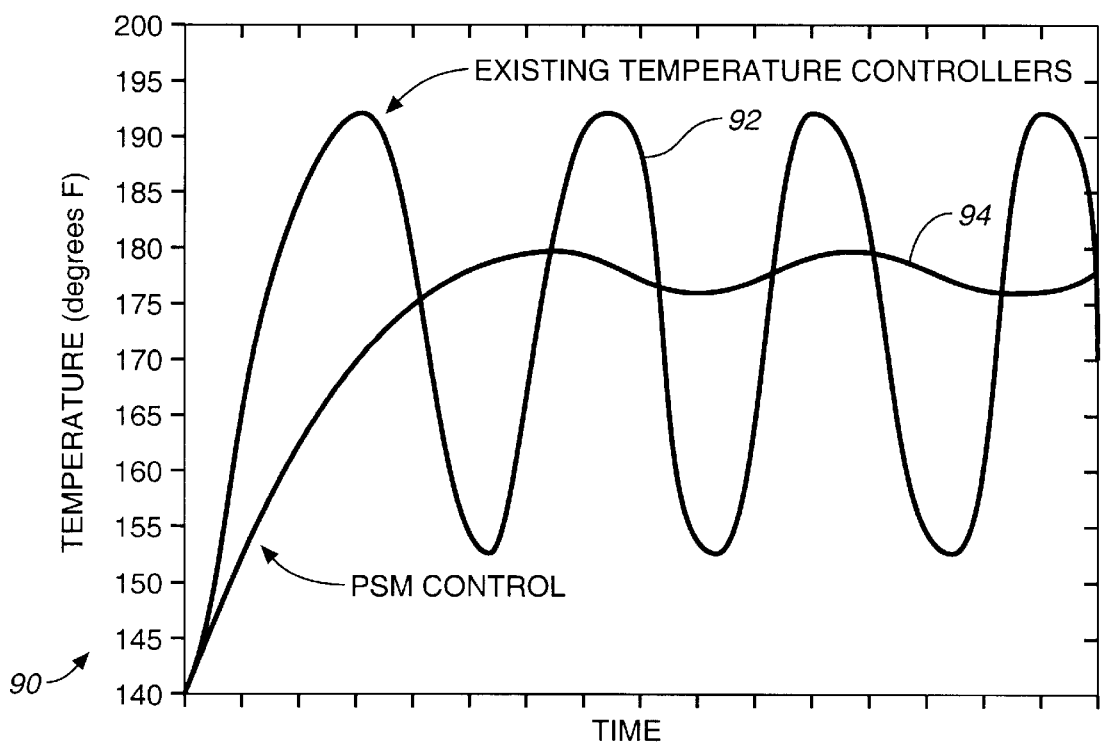
FIG._6

HIGH EFFICIENCY PULSE WIDTH MODULATOR

BACKGROUND

Typical prior art power control circuits employ an integrated circuit, along with several external components, to control the duty cycle of a power switching transistor. The duty cycle is defined as a ratio between on-time or pulse-time and duration of trigger period. The duty cycle of the power switch is used to control the output voltage waveform so that it approximates the shape of the input voltage waveform. The integrated circuits used in prior art power controllers generally include a pulse-width-modulator (PWM) circuit.

In the conventional prior art embodiment, a triangular wave is generated to compare with the input signal and, when amplified, results in a rectangular wave output in which the duty cycle is somewhat proportional to the input signal. There are multitude of drawbacks to this approach. One problem is that the output duty cycle does not accurately represent the input signal due to the fact that the triangular wave utilized for comparison is imperfect. Another problem is that there is no feedback to correct these errors.

Furthermore, a true pulse-width-modulator (PWM) circuit having a constant frequency, demands that the pulses become extremely narrow during very high (>90%) or very low (<10%) output average voltages, resulting in two problems: (1) lowered efficiency and (2) increased EMI (electromagnetic interference).

What is needed is a simple and efficient PWM in order to increase the accuracy and efficiency of the power control system, while reducing the overall cost.

SUMMARY

The present invention is unique because it discloses a PWM with a delayed feedback in order to increase accuracy and efficiency of the power control system.

One aspect of the invention is directed to a PWM comprising: (1) an input forward gain element configured to generate an output signal; (2) a feedback element configured to generate a feedback signal; and (3) an input summing junction element configured to add the input signal and the feedback signal in order to generate an input error signal having the input frequency. The input error signal is used by the input forward gain element to generate the output signal having the input frequency. The feedback element, the input forward gain element and the input summing junction element comprise a delay loop circuit.

The delay loop circuit further comprises a delay element. The delay element, in conjunction with the input summing junction and the forward gain element, generates a delayed signal having a delay loop frequency outside the input bandwidth of the input signal. As a result, the input loop circuit generates a delay loop output signal comprising a first delay loop component having a delay loop frequency and a second delay loop component having an input frequency.

In one embodiment, the delay element is coupled to the input summing junction element and to the feedback element. In another embodiment, the delay element is coupled to the input summing junction element and to the input forward gain element. Yet, in one more embodiment, the delay element is coupled to the input forward gain element and to the feedback element.

In the preferred embodiment, the apparatus further includes: (4) an inverter element configured to allow the subtraction of the input signal from the signal ouputted by the input forward gain element; (5) an output summing junction element; and (6) an output forward gain element in order to provide the improved squaring of the output pulse signals.

The output summing junction element, the inverter element, the input forward gain element and the input summing junction element comprise an outer loop circuit configured to output an outer loop signal.

The output forward gain element is configured to amplify the outer loop signal in order to generate an additional output signal having the delay loop oscillation frequency. The additional output signal is used to square the shape of the delay loop signal having the inner loop frequency.

In one embodiment, the apparatus further includes an input sampler element coupled to a source of input physical property and coupled to the outer loop circuit. The input sample element is configured to sense and convert the input physical property having the input frequency into the electrical input signal having the input frequency.

In one embodiment, the input sampler element further comprises a temperature sensor.

In another embodiment, the input sampler element further comprises an audio sensor.

The delay element can comprise: (1) a passive low pass filter; (2) a delay line; (3) an active low pass filter; (4) a passive band pass filter; (5) an active band pass filter; (6) a passive high pass filter; and (7) an active high pass filter.

Another aspect of the present invention is directed to a method for optimum power management of a physical property. The method comprises the following steps: (1) introducing an input signal having an input frequency within an input bandwidth; (2) generating an output signal comprising a feedback oscillation frequency component outside the input frequency bandwidth; (3) comparing the delay loop input and output signals; and (4) amplifying the resulting signal at the rate of the feedback oscillation frequency to square the shape of the output signal having the feedback frequency.

BRIEF DESCRIPTION OF THE DRAWINGS

FIG. 1 depicts one embodiment of the apparatus of the present invention with the eroded output signal.

FIG. 2 illustrates the diagram of the preferred embodiment of the apparatus of the present invention wherein the output signal is not eroded.

FIG. 3 shows the circuit diagram of the preferred embodiment of the apparatus of the present invention.

FIG. 4 depicts different signals of the apparatuses of FIGS. 1 and 3.

FIG. 5 shows a Delay circuit realization of the apparatus of the present invention.

FIG. 6 illustrates the comparison between the control signal generated by the existing temperature controllers and the output control signal generated by the apparatus of the present invention.

FULL DESCRIPTION OF THE PREFERRED EMBODIMENTS

FIG. 1 depicts one embodiment (10) of the apparatus of the present invention.

Follow the control system terminology, the apparatus (10) includes the following elements: the input forward gain element $G_{INPUT}$ (22), the feedback element (–H) (34), the input summing junction element $\Sigma_{IN}$ (18), and the input sampler element $S_{IN}$ (14).

The feedback element (–H) (34), the input forward gain element $G_{INPUT}$ (22), the input summing junction element $\Sigma_{IN}$ (18) and the Delay element (36) comprise a delay loop circuit.

In one embodiment, the apparatus (10) of FIG. 10 senses an all-electronic system. In an all-electronic system the sensing signal is already a voltage and the apparatus (10) does not include the input sampler element (14).

In another embodiment, the apparatus (10) system senses a servo system. In a servo system, the sampler element is a transducer or sensor that converts a physical property to an electrical signal. Examples of the sensor systems are: a thermistor for heat sensing, a tachometer for shaft resolution-per-minute (RPM) sensing, an audio measurement system for audio systems, and so on. In this embodiment, the sampler (14) converts an input signal (12) into an electrical input signal A (16).

The apparatus (10) includes a negative feedback element (–H) (34) that introduces a negative feedback signal B (38) into the delay loop circuit.

The input summing junction element $\Sigma_{INPUT}$ (18) is configured to add the input signal A (16) and the feedback signal B (38) in order to output an input error signal (19) having the input frequency $\omega$: $\epsilon_{INPUT}(\omega)$. The input frequency $\omega$ occupies a certain input bandwidth $[0, \Omega]$. The input error signal $\epsilon_{INPUT}(\omega)$ is used by the input forward gain element $G_{INPUT}$ (22) to generate the output signal C having the input frequency: $C(\omega)$. The negative feedback signal means that there is a signal loss in the inner loop circuit. This signal loss is compensated by the input forward gain element $G_{INPUT}$ (22).

In the prior art embodiment, the close loop amplifier was used to stabilize the system. In the current invention, the additional Delay element D (36) is introduced into the feedback loop in order to make the circuit unstable. More specifically, the Delay element D (36) is used in the apparatus of the present invention (10) in order to create the high frequency f oscillations outside the input frequency band: $f > \Omega$.

The delay loop circuit including the Delay element D (36) can include four embodiments.

In the first embodiment, the Delay element D (36) is coupled to the input summing junction element $\Sigma_{INPUT}$ (18) and is coupled to the feedback element (–H) (34). In the second embodiment, the Delay element D (20) is coupled to the input summing junction element $\Sigma_{INPUT}$ (18) and is coupled to input of the gain forward element $G_{INPUT}$ (22). In the third embodiment, the Delay element D (24) is coupled to the output of the input gain forward element $G_{INPUT}$ (22) before the output point (25) and is coupled to the feedback element (–H) (34). Finally, in the fourth embodiment, the Delay element D (32) is coupled to the output of the input gain forward element $G_{INPUT}$ (22) after the output point (25) and is coupled to the feedback element (–H) (34).

The apparatus (10) including the Delay element generates an output signal C comprising a first delay loop component having a delay loop frequency $C_1(f)$ and a second delay loop component having an input frequency $C_2(\omega)$.

The feedback signal B (38) is almost equal to the inverted input signal A (16): $A-B=\epsilon_{INPUT}(\omega, f) \rightarrow 0$. It follows, that the gain forward element $G_{IN}$ (22) should have a very high gain G in order to amplify a very small error signal $\epsilon_{INPUT}(\omega, f)$ (19) and to output the finite output signal C (26). The average amplitude of the output signal $<C_2(\omega)+C_1(f)>$ over the input frequency ($\omega$) is approximately equal to the amplitude of the input signal A at sufficiently high gain of the input amplifier: $G_{IN}>>1: <G_{IN} \times \epsilon_{INPUT}(\omega,f)>=<C_2(\omega)+C_1(f)>\sim A$.

To achieve this result, the apparatus (10) should have a variable duty cycle by generating the non-zero f-component $C_1(f)$ of the output signal C.

For a typical input amplifier $G_{IN}$ the gain is not constant. Indeed, when the input voltage is in the middle of the pulse, the gain is high. If voltage approaches the end points of the pulse, the gain goes down. As a result, the output signal represents a rounded pulse.

FIG. 4 depicts the input signal A ($\omega$) (16) that oscillates with the input frequency $\omega$, the feedback signal B ($\omega$) (38) that also oscillates with the input frequency $\omega$, and the f-component of the output signal $C_1$ (f) (26 of the apparatus (10) of FIG. 1) that oscillates with the delay loop frequency f. In the exploded view (59) it is clearly seen that the output $C_1$ (f) signal does not square enough, so that the output signal $C_1$ (f) is eroded.

To deal with this problem, it is sufficient to include in the circuit another amplifier (pulse-shaper) with a high gain $G_{OUT}>>1$ that can shape the output pulse $C_1$ (f).

In the preferred embodiment, the apparatus (60) of FIG. 3 eliminates the erosion of the output signal $C_1$ (f) of the apparatus (10) of FIG. 1.

The apparatus (60) in addition to the elements of the apparatus (10) of FIG. 1 (the input forward gain element $G_{INPUT}$ (22), the feedback element (–H) (34), the input sampler element $S_{IN}$ (14), and the input summing junction element $\Sigma_{IN}$ (18)) also includes the following elements: an inverter element [–1] (52), an output summing junction element $\Sigma_{OUT}$ (54), and an output forward gain element $G_{OUT}$ (56). The output summing junction element, the inverter element, the input forward gain element and the input summing junction element comprise an outer loop circuit. The inverter element (52) in conjunction with the summing element (54) in the outer loop circuit allows the substraction of the output delay loop signal C and the input signal A. Thus, the outer loop outputs the output signal (55) that is amplified by the output gain element (56). Thus, the application of the outer loop circuit and the output gain element (56) to the delay loop output signal results in the squaring of the output signal (58) F(f).

Thus, the apparatus (60) of FIG. 3 emulates a very efficient pulse width modulator (PWM) with a feedback.

The Delay element (36) of FIG. 1 can be implemented using: a passive low pass filter, a delay line, an active low pass filter, a passive band pass filter, an active band pass filter, a passive high pass filter, and an active high pass filter.

In one embodiment, as shown in FIG. 5, the Delay element (36), the invertor (52) and the output summing junction (54) can be implemented using an operational amplifier 1/4 LM324 manufactured by Motorola®, two resistors and two capacitors.

As was mentioned above, a prior art true pulse-width-modulator (PWM) circuit having a constant frequency, demands that the pulses become extremely narrow during very high (>90%) or very low (<10%) output average voltages. This results in two problems: a prior art true PWM has a low efficiency and an increased EMI (electromagnetic interference).

The apparatus of the present invention (60 of FIG. 3) can be called a pseudo pulse-width-modulator because it is free of these two above-mentioned problems. Indeed, the narrow pulse problem of the true PWM is remedied by the fact that the minimum pulse width of the output pulse signal of the present invention is equal to the delay of the feedback element. Thus, the frequency changes in order to allow a reasonable pulse width of the output pulse signal (58). A reasonable pulse with is not too short, so that EMT (electromagnetic interference) is not too high (low EMT), and not too wide, so that the induction element of the output motor is capable of smoothing the output pulse signal F(f) of FIG. 4.

The apparatus of the present invention can be used as a new fan control technology for automobile cooling systems. The control apparatus of the present invention is able to stabilize a water cooled engine temperature by varying the fan speed. To date, this method of fan control has been possible only with the use of very expensive components with relatively low reliability caused by the heat generated in these components. The apparatus of the present invention is able to supply up to 20 Amps of continuous DC current and vary the fan speed anywhere from off to full rotation with inexpensive parts and very high reliability. The sensor continuously measures the water temperature and continuously updates the fan speed to maintain constant engine temperature.

Traditional fan control methods turn the fan fully on and completely off (see curve 92 of FIG. 6). This allows the engine to heat until the fan turns on and the fan cools the engine down, then shuts off. The continuous thermal cycle that occurs is not good for an engine and will stress the engine's critical seals and parts. Engines are designed for optimum performance at a specific temperature, typically 180 degrees F. The apparatus of the present invention maintains a constant temperature by varying the fan speed to keep the water temperature constant which greatly reduces stress and keeps the engine very close to the optimum temperature it was designed for (see curve 94 of FIG. 6).

The present invention also includes a method for optimum power management of a physical properly.

In one embodiment, the method comprises the following steps: (1) introducing an input signal having an input frequency within an input bandwidth; (2) generating an output signal comprising a feedback oscillation frequency component outside the input frequency bandwidth; and (3) outputting the output signal in order to manage the physical property at the rate of the feedback oscillation frequency.

In another embodiment, the above-described method further comprises the following steps: (4) comparing and (5) amplifying the delay loop output and input signals at the rate of the feedback oscillation frequency to square the shape of the output signal having the feedback frequency.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. An apparatus responsive to an input signal having an input frequency within an input bandwidth for optimum power management of a physical property, said apparatus comprising:

an input forward gain element configured to generate an output signal;

a feedback element connected to said input forward gain element, wherein said feedback element is configured to attenuate and invert said output signal and configured to generate an attenuated and inverted output signal;

a delay element connected to said feedback element, wherein said delay element is configured to delay said attenuated, inverted output signal and configured to output an attenuated, inverted and delayed output signal; said attenuated, inverted and delayed output signal being a feedback signal; and an input summing junction element connected to said delay element and connected to said input forward gain element, wherein said input summing junction element is configured to sum said input signal and said feedback signal and is configured to output a summed signal to an input of said input forward gain element, wherein said summed signal is an input error signal having the input frequency;

wherein said input error signal is used by said input forward gain element to generate said output signal having the input frequency;

wherein said feedback element, said input forward gain element and said input summing junction element comprise a delay loop circuit;

and wherein said delay loop circuit is configured to generate a delay loop output signal comprising a first delay loop component having a delay loop frequency outside the input bandwidth of said input signal and a second delay loop component having the input frequency;

and wherein said first delay loop component having the delay loop frequency is used to manage said physical property at the rate of the delay loop frequency.

2. The apparatus of claim 1, wherein said delay element is coupled to said input summing junction element and is coupled to said feedback element.

3. The apparatus of claim 1, wherein said delay element is coupled to said input summing junction element and is coupled to said input forward gain element.

4. The apparatus of claim 1, wherein said delay element is coupled to said input forward gain element and is coupled to said feedback element.

5. The apparatus of claim 1 further comprising:

an inverter element coupled to said input summing junction element outside said delay loop circuit, wherein said inverter element is configured to invert said input signal and configured to output an inverted input signal;

an output summing junction element coupled to said inverter element and coupled to the output of said input forward gain element outside said delay loop circuit; wherein said output summing junction element, said inverter element, said input forward gain element and said input summing junction element comprise an outer loop circuit; and wherein said outer loop circuit is configured to output an outer loop signal; and an output forward gain element coupled to said output summing junction element outside said outer loop circuit;

wherein said output summing junction element is configured to sum said output signal generated by said output forward gain element and said inverted input signal;

and wherein said outer loop signal comprises a summation of said output signal generated by said output forward gain element and said inverted input signal;

wherein said output forward gain element is configured to amplify said outer loop signal in order to square the shape of said delay loop signal having the delay loop frequency.

6. The apparatus of claim 5 further comprising:

an input sampler element coupled to a source of input physical property with a frequency equal to the input frequency and coupled to said outer loop circuit, wherein said input sampler element is configured to sense and convert said input physical property having the input frequency into the input signal having the input frequency.

7. The apparatus of claim 5 further comprising:

an output sampler element coupled to an output physical property and coupled to said outer loop, wherein said output sampler element is configured to convert the outer loop output signal into said output physical property at the rate of the delay loop frequency in order to manage said output physical property at the rate of said delay loop frequency.

8. The control system of claim 6, wherein said input sampler element further comprises:

a temperature sensor.

9. The apparatus of claim 6, wherein said input sampler element further comprises:

an audio sensor.

10. The apparatus of claim 1, wherein said delay element further comprises:

a passive low pass filter.

11. The apparatus of claim 1, wherein said delay element further comprises:

an active low pass filter.

12. The apparatus of claim 1, wherein said delay element further comprises:

a passive band pass filter.

13. The apparatus of claim 1, wherein said delay element further comprises:

an active band pass filter.

14. The apparatus of claim 1, wherein said delay element further comprises:

a passive high pass filter.

15. The apparatus of claim 1, wherein said delay element further comprises:

an active high pass filter.

16. The apparatus of claim 1, wherein said delay element further comprises:

a delay line.

* * * * *